United States Patent
Botelho et al.

(10) Patent No.: US 8,246,867 B2
(45) Date of Patent: Aug. 21, 2012

(54) METHOD FOR ASSEMBLING AN OPTOELECTRONIC DEVICE

(75) Inventors: John W. Botelho, Corning, NY (US); Diane K. Guilfoyle, Painted Post, NY (US); Linda F. Reynolds-Heffer, Elmira, NY (US); Brian P. Strines, Painted Post, NY (US); Kathleen A. Wexell, Corning, NY (US)

(73) Assignee: Corning Incorporated, Corning, NY (US)

( * ) Notice: Subject to any disclaimer, the term of this patent is extended or adjusted under 35 U.S.C. 154(b) by 286 days.

(21) Appl. No.: 12/580,490

(22) Filed: Oct. 16, 2009

(65) Prior Publication Data

US 2011/0089587 A1    Apr. 21, 2011

(51) Int. Cl.
*B29D 11/00* (2006.01)
*B29C 43/18* (2006.01)

(52) U.S. Cl. ..... 264/1.7; 264/2.6; 264/129; 264/272.17; 427/96.2; 427/165

(58) Field of Classification Search ............ 264/1.1, 264/1.7, 272.11, 272.17, 2.6, 129, 309; 427/96.2, 427/164, 165; 425/374
See application file for complete search history.

(56) References Cited

U.S. PATENT DOCUMENTS

| | | | |
|---|---|---|---|
| 6,911,491 B2 * | 6/2005 | Brinkman | 524/310 |
| 6,936,131 B2 | 8/2005 | McCormick et al. | 156/292 |
| 7,005,799 B2 | 2/2006 | Booth, Jr. et al. | 313/512 |
| 7,030,558 B2 | 4/2006 | Park et al. | 313/512 |
| 7,078,726 B2 | 7/2006 | Pichler et al. | 257/40 |
| 7,190,115 B2 | 3/2007 | Tsuchiya et al. | 313/512 |
| 7,202,602 B2 | 4/2007 | Anandan | 313/512 |
| 7,205,718 B2 | 4/2007 | Cok | 313/512 |
| 7,282,856 B2 | 10/2007 | Iwase et al. | 313/512 |
| 7,381,110 B1 | 6/2008 | Sampica et al. | 445/24 |
| 7,435,311 B1 | 10/2008 | Marzen et al. | 156/286 |
| 7,452,258 B1 | 11/2008 | Marzen et al. | 445/25 |
| 7,466,075 B2 | 12/2008 | Cok et al. | 313/506 |
| 7,531,955 B2 | 5/2009 | Cok et al. | 313/501 |
| 7,538,354 B2 | 5/2009 | Hayashi et al. | 257/79 |
| 2003/0218422 A1 | 11/2003 | Park et al. | 313/512 |
| 2005/0023960 A1 | 2/2005 | Harada et al. | 313/502 |
| 2005/0248270 A1 | 11/2005 | Ghosh et al. | 313/512 |
| 2006/0260122 A1 * | 11/2006 | Honjo et al. | 29/829 |
| 2007/0089620 A1 | 4/2007 | Kim et al. | 101/123 |
| 2007/0170324 A1 | 7/2007 | Lee et al. | 248/247 |
| 2007/0170855 A1 | 7/2007 | Choi et al. | 313/512 |
| 2007/0170857 A1 | 7/2007 | Choi et al. | 313/512 |

(Continued)

FOREIGN PATENT DOCUMENTS

EP     1 361 556     11/2003

(Continued)

*Primary Examiner* — Mathieu D. Vargot
(74) *Attorney, Agent, or Firm* — Kevin M. Able; Stephen Wentsler

(57) ABSTRACT

Methods for assembling an optoelectronic device are provided. The optoelectronic device includes a first transparent substrate, a second substrate, and environmentally sensitive components. The methods comprise the step of applying a fill material to a surface of at least one of the substrates, and lowering a viscosity of the fill material. The methods further comprise the step of pressing the first transparent substrate and the second substrate together such that the fill material substantially fills an area between the first transparent substrate and the second substrate and substantially encapsulates exposed portions of the environmentally sensitive components. The methods still further comprise the step of sealing the first transparent substrate and the second substrate together to hermetically seal the fill material within the area.

18 Claims, 3 Drawing Sheets

U.S. PATENT DOCUMENTS

| | | | |
|---|---|---|---|
| 2007/0170860 A1 | 7/2007 | Choi et al. | 313/512 |
| 2007/0170861 A1 | 7/2007 | Lee et al. | 313/512 |
| 2007/0247068 A1 | 10/2007 | Park | 313/512 |
| 2008/0111479 A1 | 5/2008 | Choi | 313/504 |
| 2008/0143247 A1 | 6/2008 | Kim et al. | 313/504 |
| 2008/0238311 A1 | 10/2008 | Sung et al. | 313/512 |
| 2008/0239637 A1 | 10/2008 | Sung et al. | 361/681 |
| 2008/0290798 A1 | 11/2008 | Quesada | 313/512 |
| 2008/0297042 A1 | 12/2008 | Ahn et al. | 313/504 |
| 2009/0020592 A1 | 1/2009 | Lee et al. | 228/205 |
| 2009/0029623 A1 | 1/2009 | Son et al. | 445/25 |
| 2009/0134786 A1 | 5/2009 | Matsuzaki et al. | 313/504 |
| 2009/0200930 A1 | 8/2009 | Hayashi | 313/504 |

FOREIGN PATENT DOCUMENTS

| | | |
|---|---|---|
| EP | 1 933 398 | 6/2008 |

* cited by examiner

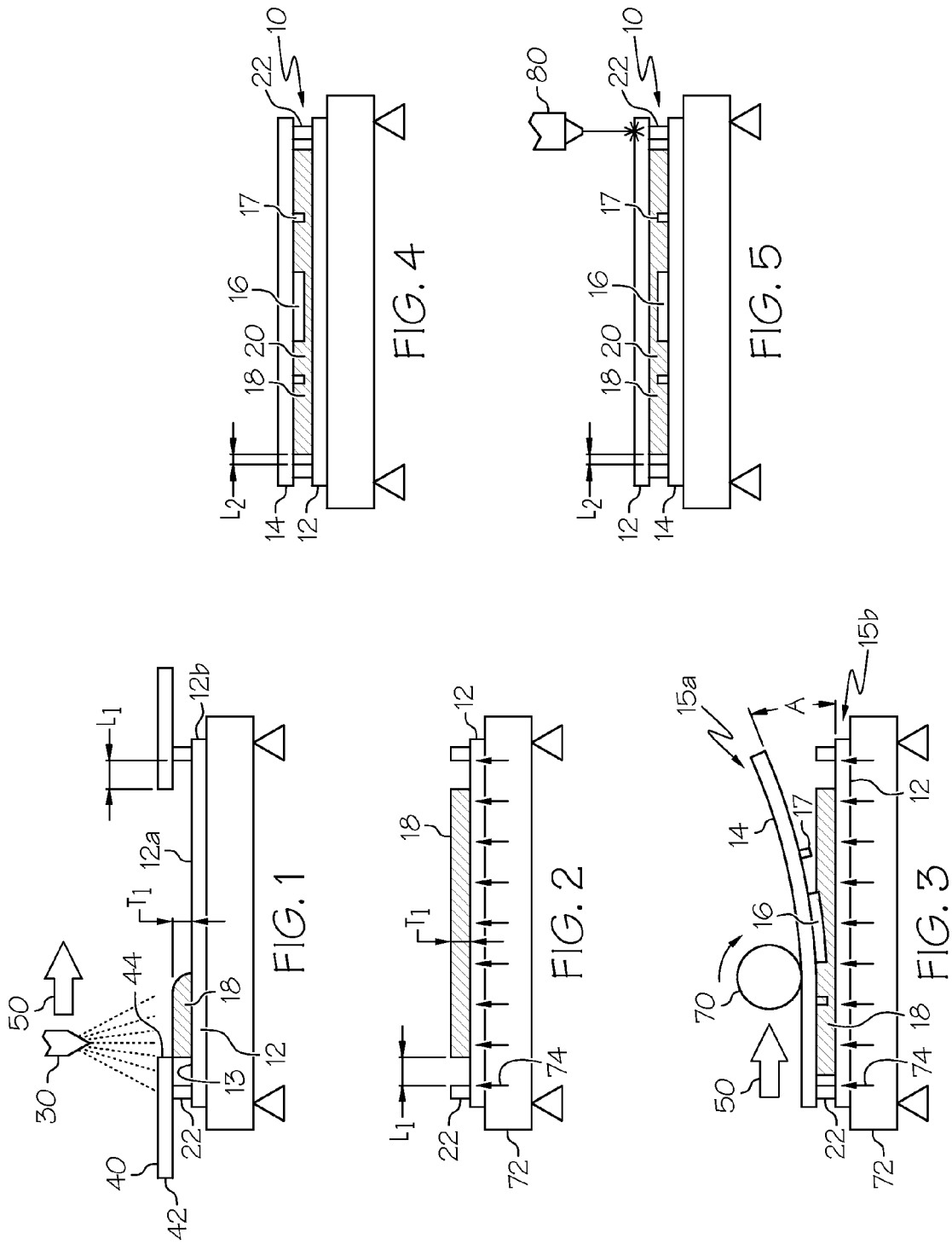

METHOD FOR ASSEMBLING AN OPTOELECTRONIC DEVICE

FIELD

The present invention relates generally to methods for assembling, and more particularly, to methods for assembling an optoelectronic device.

BACKGROUND

It is known to assemble an optoelectronic device with a material filling a cavity between a top cover and a backplane of the optoelectronics device. The fill material can provide a wide range of benefits. For instance, the fill material can help maintain a desired spacing between the top cover and the backplane and/or accommodate sag that may occur with relatively large panel displays. In further examples, the fill material may help protect the optoelectronic components from moisture, oxygen and/or other contaminants.

SUMMARY

The following presents a simplified summary of the disclosure in order to provide a basic understanding of some example aspects described in the detailed description.

In one example aspect, a method for assembling an optoelectronic device is provided. The optoelectronic device includes a first transparent substrate, a second substrate, and environmentally sensitive components. The method includes the steps of applying a fill material to a surface of at least one of the substrates, and lowering a viscosity of the fill material. The method further includes the step of pressing the first transparent glass substrate and the second substrate together such that the fill material substantially fills an area between the first transparent substrate and the second substrate and substantially encapsulates exposed portions of the environmentally sensitive components. The method still further includes the step of sealing the first transparent substrate and the second substrate together to hermetically seal the fill material within the area.

BRIEF DESCRIPTION OF THE DRAWINGS

These and other features, aspects and advantages of the present disclosure are better understood when the following detailed description is read with reference to the accompanying drawings, in which:

FIG. 1 schematically illustrates masking an area of a first transparent substrate and then spraying a fill material to a surface of the first transparent substrate;

FIG. 2 schematically illustrates lowering the viscosity of the fill material by heating the first transparent substrate;

FIG. 3 schematically illustrates using a roller travelling in a pressing direction to press the first transparent substrate and the second substrate together;

FIG. 4 schematically illustrates the first transparent substrate and the second substrate after being pressed together by the roller;

FIG. 5 schematically illustrates sealing the first transparent substrate and the second substrate together to hermetically seal the fill material within the area;

DETAILED DESCRIPTION

Figure 6:
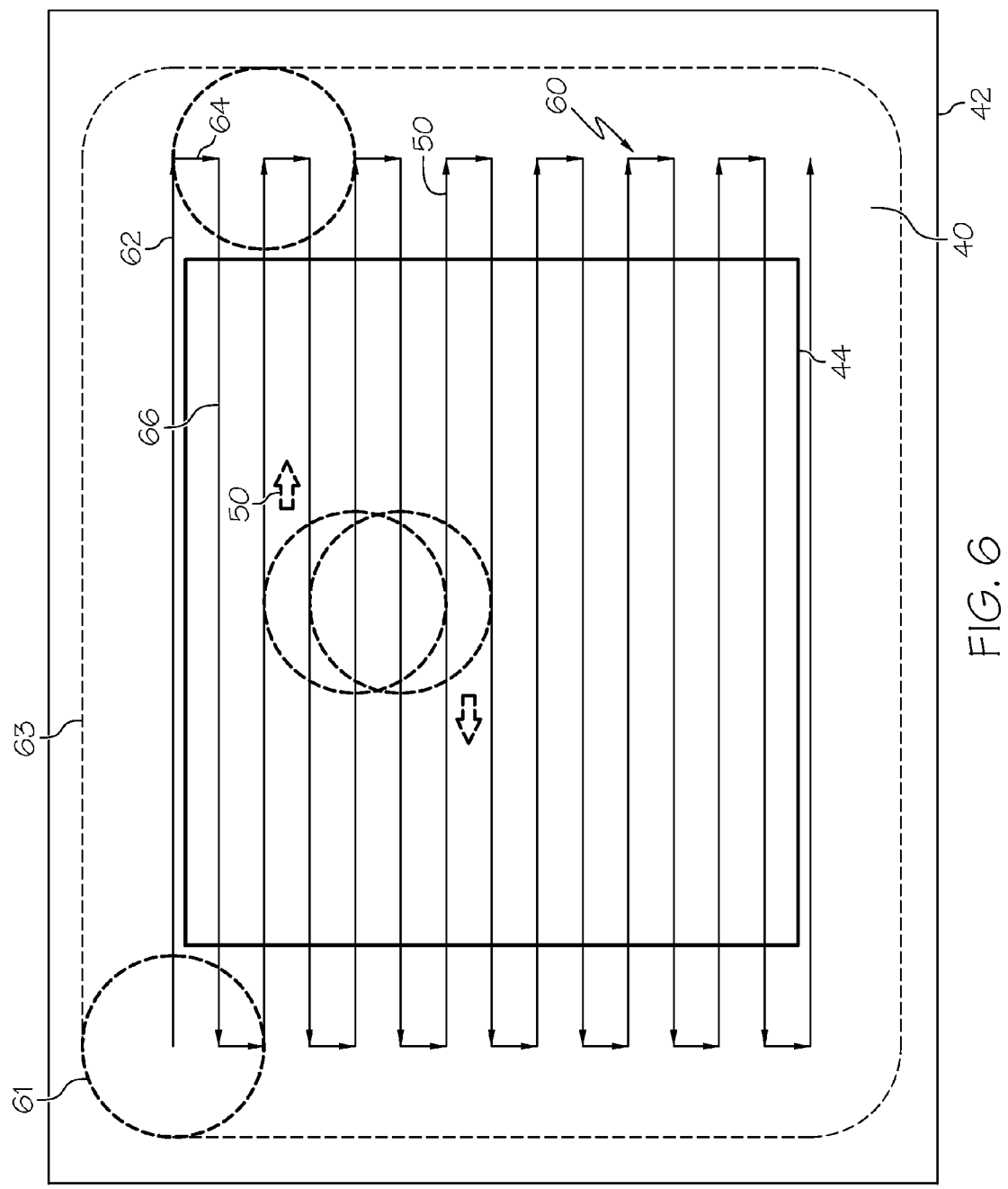
FIG. 6 is a top schematic view of fill material being applied to the first transparent substrate along substantially parallel rows in the pressing direction.

Methods will now be described more fully hereinafter with reference to the accompanying drawings in which example embodiments of the disclosure are shown. Whenever possible, the same reference numerals are used throughout the drawings to refer to the same or like parts. However, this disclosure may be embodied in many different forms and should not be construed as limited to the embodiments set forth herein.

Example methods herein involve assembling an optoelectronic device such as lighting panel devices, photovoltaic devices, organic light-emitting diode (OLED) devices, or other optoelectronic devices. As shown in FIG. 5, the optoelectronic device 10 may include an OLED flat panel display with first transparent substrate 12 and a second substrate 14. The first and second substrate can have a diagonal that is larger than 17 cm although smaller sizes may be assembled in further examples.

The first transparent substrate 12 can comprise glass suitable for a liquid crystal display and the second substrate 14 can comprise glass or other material designed to support various environmentally sensitive components 16 that are sensitive to moisture, oxygen and/or other environmental conditions. The environmentally sensitive components 16 may comprise optoelectronic, electronic, or mechanical components, of various optoelectronic devices. For instance, the environmentally sensitive components 16 may comprise components of an OLED such as an emissive layer, a conductive layer, and anode and cathode terminals. In a further example, the environmentally sensitive components 16 may comprise components of a photovoltaic device such as solar cells, photovoltaic arrays, or the like.

The optoelectronic device 10 further includes a fill material 18 substantially filling an area 20 between the first transparent substrate 12 and the second substrate 14. As shown, the fill material 18 substantially encapsulates exposed portions 17 of the environmentally sensitive components 16. The fill material 18 can comprise transparent silicone although various other fill materials may be used. Example fill materials have sufficient wettability during application to fully encapsulate the exposed portions 17 of the environmentally sensitive components 16. The fill material 18 can also avoid outgassing or reaction by-products when curing. Once cured, the fill material 18 may be sufficiently rigid to mitigate sag. Still further, the fill material 18 can be selected to maintain optical clarity for the life of the optoelectronic device 10. The viscosity and refractive index of the fill material 18 can also be selected to provide desirable features when assembling the optoelectronic device and during subsequent use. For example, before the fill material 18 is heated to a target temperature as described below, the viscosity of the fill material 18 (e.g., transparent silicone) can be within a range from about 30 cP to about 3500 cP, such as about 1750 cP. The refractive index of the fill material (e.g., transparent silicone) at 643.8 nm can be within a range from 1.5 to about 1.8, such as 1.54. The refractive index of the fill material can be selected within this range to avoid internal reflection and obtain high light transmission.

FIG. 4 further illustrates the first transparent substrate 12 being sealed to the second substrate 14 by way of a perimeter frit 22 circumscribing the area 20. The frit can act to hermetically seal the fill material 18 within the area 20. Once sealed, the perimeter frit 22 protects the environmentally sensitive components from contamination by various environmental conditions.

FIGS. 1-5 illustrate various method steps for assembling the optoelectronic device 10. FIG. 1 illustrates a mask 40 that may be provided in some examples to help control the application of the fill material 18 to a desired target surface area of the first transparent substrate 12. If provided, the mask 40 can be secured over the first transparent substrate 12, for example, with a double-stick tape. Once secured, the outside edges 42 of the mask 40 may be designed to extend outwardly beyond the edges 12b of the first transparent substrate 12 to protect the non-target area from contamination. For instance, the outside edges 42 of the mask 40 can be designed to extend at least 10 mm outwardly beyond the edges 12b of the first transparent substrate 12.

The inside edges 44 of the mask 40 define a void that determines the footprint and therefore the target area of application of the fill material 18 by various techniques described below. These inside edges 44 of the mask 40 can be positioned inwardly beyond the inside edges of the perimeter frit 22 by a distance $L_1$ in order to protect the non-target area. Indeed, as shown the protected non-target area includes the perimeter frit 22 as well as an inward protected area 13 of the surface 12a that circumscribes the target area of the surface 12a. In one example, $L_1$ is about 12.5 mm although other distances may be used in further examples. In such a manner, the mask 40 can help prevent applied fill material 18 from contacting the perimeter frit 22 during the application, pressing and sealing steps of the method of assembling as described below. Thus, the mask allows the fill material 18 to be applied along a target surface area that is less than an interior surface area circumscribed by the perimeter frit 22.

As described above, the fill material 18 may be applied to a surface 12a of the first transparent substrate 12. In addition, or alternatively, the fill material may be applied to the second substrate 14. The fill material 18 may be applied with various techniques. For example, the fill material 18 may be applied by spray screen printing, ink jet, or the like, where each results in appropriate application of the fill material 18 to the surface of the substrate.

As shown in FIG. 1, a spray device 30 may used to spray coat the fill material 18 on the surface 12a of the first transparent substrate 12. The nozzle of the spray device 30 may be positioned at a constant height above the surface 12a of the first transparent substrate 12 to provide a substantially consistent spray pattern. The increase of the height enlarges the spray pattern covered by the sprayed fill material 18. In one example, the height is 3.81 cm (1.5 inch). The thickness $T_1$ of the sprayed fill material 18 on the first transparent substrate 12 can be controlled by adjusting various parameters of the spray device 30. For instance, the pressure associated with the source of fill material can be adjusted to increase or decrease the volumetric rate of fill material 18 being applied by the spray device 30. In further examples, the nozzle of the spray device 30 may be adjusted to change the spray pattern and/or volumetric rate of the fill material. As shown in FIGS. 1 and 2, the final thickness $T_1$ of the sprayed fill material 18 can be provided with a substantially constant thickness across the entire coated area. In one example, the thickness $T_1$ is about 10 μm with other thicknesses being provided in further examples.

The fill material applicator (e.g., the spray device 30) may remain stationary or may be moved relative to the first transparent substrate 12 during the process of applying the fill material 18 to the surface 12a. In one example, the applicator may remain stationary while the first transparent substrate 12 is moved relative to the stationary applicator. In addition, or alternatively, the first transparent substrate 12 may remain stationary while the applicator is moved relative to the stationary substrate. As shown in FIG. 1, the spray device 30 moves relative to a stationary substrate when applying the fill material 18.

Various relative velocities between the applicator and the first transparent substrate may be selected during application of the fill material 18. The relative velocity can be maximized to reduce application time while still being low enough to allow sufficient fill material 18 to be applied to the surface 12a. In one example, the spray device 30 can be moved relative to the first transparent substrate 12 at a rate of 12.7 cm/sec (5 in/sec).

The fill material 18 may be applied in various patterns and may be applied as a continuous or discontinuous pattern. As shown, the fill material 18 can be applied in a pressing direction 50 that can allow the fill material 18 to be applied along substantially parallel rows. As shown in FIG. 6, the applicator, such as the illustrated spray device 30, can travel along a serpentine application path 60 on the first transparent substrate 12 with respect to the pressing direction 50 of the roller 70. As shown, a controller and actuator can be designed to direct the spray device 30 along a first spraying path 62 along the pressing direction 50. The spray device 30 can then travel along a linking segment 64 to a second spraying path 66. The spray device 30 can then travel along the second spraying path 66 opposite the pressing direction 50. The process can continue wherein, as shown, the spray device 30 travels along the serpentine application path 60. As shown, a spray pattern 61 of the first and second spraying path can overlap one another as the spray device 30 travels along the serpentine application path 60. Overlapping the spray paths can provide a desired spray distribution across the surface 12a. In the illustrated example, the depth of the fill material is maximized along the serpentine application path 60. Thus, relatively deep rows of fill material can be oriented along parallel rows of the serpentine application path 60 in the pressing direction 50.

The spray device 30 can be configured to apply material continuously as the spray device 30 travels along the serpentine application path 60. In such instances, the mask 40 may act to block substantial application of fill material 18 at the linking segments 64 of the serpentine application path 60. For example, as shown in FIG. 6, the entire spray pattern 61 is shielded by the mask 40 at the linking segments 64. As such, directional changes in the serpentine path do not result in uneven distribution of fill material 18 as the spray device 30 travels from one row to another by way of the linking segments 64. Alternatively, the spray device 30 may only operate when traveling along the first spraying path 62 and the second spraying path 66 (and subsequent parallel paths). As such, excess fill material 18 may be saved.

Once the spray process is complete, the above-referenced application process results in fill material 18 that is applied along substantially parallel rows in the pressing direction 50. The width of each row of fill material 18 is defined by the nozzle spray pattern 61 and can be selected to provide an adequate amount of fill material 18 to properly fill the area 20 between the first transparent substrate 12 and the second substrate 14. The nozzle spray pattern 61 and the proper characteristics of rows of fill material 18 can be achieved by adjusting attributes of the spray device, such as the height of the nozzle above the surface 12a, spray device velocity, nozzle orifice characteristics, the pressure of the source of fill material 18 or other spray device attributes. The illustrated application pattern of the fill material 18 is provided for illustrative purposes and other spray patterns may be used in other examples. For instance, application (e.g., spraying) may occur in other directions and/or with other patterns depending on the ambient air temperature, initial fill material viscosity, flow characteristics, etc.

FIG. 2 schematically illustrates lowering the viscosity of the fill material 18. Lowering the viscosity of the fill material 18 has various advantages. For example, with lower viscosity, the assembly process may proceed more rapidly as the fill material 18 flows better. Furthermore, lowering the viscosity of the fill material 18 can increase the wettability of the fill material 18 to allow full encapsulation of the exposed portions 17 of the environmentally sensitive components 16. Still further, lower viscosity can reduce the probability of bubble formation. However, in certain examples, it can be desirable to prevent excessive lowering of the material viscosity. For instance, in certain applications, excessive lowering the viscosity of the fill material 18 may cause uncontrolled flowing of the fill material 18 toward the perimeter frit 22 and possible undesirable contact with the perimeter frit 22. Accordingly, based on the characteristics of the fill material 18 and application considerations, the viscosity of the fill material 18 may be lowered to a desired range to avoid uncontrolled flowing of the fill material 18 while still obtaining the above-mentioned benefits.

Lowering the viscosity of the fill material 18 can be achieved using various techniques. For example, arrows 74 indicate heat that can be indirectly applied to the fill material 18 by heating the first transparent substrate 12. A hot plate 72 or other heating device can be used to conduct heat to the first transparent substrate 12 which, in turn, conducts the heat to the fill material 18 to raise the fill material 18 to a target temperature. The hot plate 72 can be configured to provide an even heat distribution to the fill material 18 applied to the first transparent substrate 12. The first transparent substrate 12 may be preheated before applying the fill material 18. Optionally, heating may start during or after applying the fill material 18. Heating of the fill material 18 can alternatively be applied by other indirect methods such as convection or radiation of heat either directly or indirectly to the first transparent substrate 12 which then, in turn, conducts the heat to the fill material 18. In still further examples, the fill material 18 can be directly heated. For example, heat may be directly transferred by convection to the fill material 18. For example, a convection air stream can be used to transfer heat directly to the fill material 18. In further examples, radiation (e.g. infrared radiation) can be used to transfer heat directly to the fill material 18. Regardless of the heating configuration used, the temperature of the fill material 18 eventually reaches the target temperature and the viscosity of the fill material 18 is thus lowered to a desired range. In one example, the target temperature can be about 40° C.

The viscosity of the fill material 18 may be lowered in ways other than heating the fill material 18. For example, the viscosity of the fill material 18 can be lowered by applying a stress to an isotropic fill material. In yet another example, the viscosity of the fill material may be lowered by introducing an additive, such as a liquid or chemical additive.

FIG. 3 illustrates pressing the second substrate 14 and the first transparent substrate 12 together such that the fill material 18 substantially fills an area 20 between the second substrate 14 and the first transparent substrate 12 and encapsulates exposed portions 17 of the environmentally sensitive components 16. In order to prevent the curing of the fill material 18 on the first transparent substrate 12 before finishing assembly, the step of pressing may be performed immediately after heating the fill material 18 on the first transparent substrate 12 to the appropriate target temperature. The second substrate 14 with the environmentally sensitive components 16 may also be heated to a target temperature substantially the same as the temperature of the first transparent substrate 12. In such a manner, the heat sink effect of the second substrate 14 which may cause the viscosity change of the fill material 18 is prevented during the pressing process. In one example, the temperature of the second substrate 14 is heated to about 40° C. by the hot plate 72 before the pressing and maintained until the pressing is finished.

As shown in FIG. 3, the second substrate 14 may be bent relative to the first transparent substrate 12 while pressing the substrates together. For example, as shown, the area of the second substrate 14 can have a curved orientation until rolled into an orientation that is parallel with the corresponding portions of the first transparent substrate 12. As shown, an angle "A" can be provided between corresponding end portions 15a, 15b of the second substrate 14 and the first transparent substrate 12, respectively. For instance, the second substrate 14 can be flexible such that corresponding end portions 15a, 15b of the substrates 14, 12 are initially held at an angle "A" with respect to one another while the second substrate 14 and the first transparent substrate 12 are pressed together along the pressing direction 50. The initial angle "A" can be various angles according to the optoelectronic device characteristics such as the viscosity of the fill material 18, the material of the second substrate 14, the size of the optoelectronic device 10 or other characteristic. Example initial angles "A" can be within a range from about 2° to about 45°, such as about 5° to about 15°, such as about 10°. The angle "A" between corresponding end portions 15a, 15b may remain substantially at the initial angle "A" throughout the pressing process. In further examples, the angle may begin at the initial angle "A" and then change throughout the pressing process. For example, the initial angle "A" may be greater at the beginning of the pressing process and then reduce throughout the pressing process. Holding the end portions 15a, 15b at the angle "A" while pressing the substrates together in the pressing direction 50 can help prevent trapping of air bubbles within the fill material 18 and can further facilitate full encapsulation of the exposed portions 17 of the environmentally sensitive components 16.

Various devices may be used to facilitate pressing of the second substrate 14 and the first transparent substrate 12 together in the pressing direction 50. For example, a non-rotatable slider may be used to slide against the outer surface of the second substrate 14 in the pressing direction 50. In further examples a rotatable member may be used for pressing. For example, as shown in FIG. 3, a roller 70 can be used to press the second substrate 14 and the first transparent substrate 12 together. The roller 70 may be placed atop a first end portion of the second substrate 14 where the second substrate 14 and the first transparent substrate 12 have been brought into contact along the first end portions. While securely holding the second substrate 14, the roller 70 may then be traversed across the substrate stack in the pressing direction 50 with sufficient downward force to press the two substrates together with the fill material 18 therebetween. During the motion of the roller 70, the free end portion of the second substrate 14 is allowed to approach the first transparent substrate 12 but maintain the angle "A" of inclination between the two substrates to allow air to escape from between the second substrate 14 and the fill material 18 while simultaneously ensuring full wetting of the second substrate 14 with the fill material 18. The second substrate 14 is bent relative to the first transparent substrate 12 as the two substrates are pressed together by the motion of the roller 70.

As shown, the second substrate 14 may be pressed toward the first transparent substrate 12 until the perimeter frit 22 is engaged with the second substrate 14. The perimeter frit 22 can then act as a spacer to maintain a desired minimum spacing between the substrates. In such applications, the roller 70, or other pressing device, may extend beyond the foot print circumscribed by the perimeter frit 22, thereby simultaneously forcing the second substrate 14 against opposed portions of the perimeter frit 22.

The pressing device may optionally be covered by a protective layer to prevent damage (e.g., scratching) of the second substrate 14. For instance, the pressing device may include a protective membrane, such as paper or other material to help apply force without the risk of damaging the second substrate 14. In further examples, the pressing device may be provided with a layer of resilient material, such as soft rubber or silicone. In still further examples, the pressing device may be provided with a friction reducing layer, such as a Nylon or polytetrafluoroethylene (PTFE) layer. The protective layer can help distribute force over the substrate to avoid stress concentrations. Moreover, the protective layer can also help distribute the pressing force to the fill material 18, and consequently the underlying environmentally sensitive components 16. In still further examples, the protective layer may be designed avoid trapping glass particles that can subsequently scratch the substrate.

As shown in FIG. 4, the fill material 18 substantially fills an area between the two substrates once the roller has traversed across the entire surface area of the second substrate 14. As such, the fill material 18 substantially fills the area between the two substrates without trapping air bubbles and also fully wets and thereafter encapsulates the exposed portions 17 of the environmentally sensitive components 16. As shown, after pressing, the fill material 18 can engage the interior surface area without engaging the perimeter frit 22. Indeed, depending upon the fill material viscosity and curing rate, the fill material 18 will continue to migrate toward the outer edge of the target fill area. However, once pressing is complete, the fill material 18 stops short of engaging the perimeter frit 22 and can stop such that a final distance $L_2$ is left between the fill material 18 to the inside edge of the perimeter frit 22. For example, the final distance $L_2$ can be within a range from about 2 mm to about 10 mm, such as about 3 mm to about 5 mm. Arranging for the fill material 18 to migrate toward, but without touching, the perimeter frit 22 when pressing the substrates together can prevent contamination of the perimeter frit 22. Any such contamination of the perimeter frit 22 may undesirably interfere with successful hermetic sealing of the fill material 18 within the area 20 during the step of sealing the first transparent substrate 12 to the second substrate 14.

Once fully pressed in place, the fill material 18 may then be post-cured. Post-curing may occur before or after the step of sealing described below. Post-curing may occur at room temperature or accelerated by raising the temperature of the assembled optoelectronic device. Furthermore, post-curing may be activated by other techniques such as exposing a UV-curable fill material to a source of ultraviolet radiation. Post-curing the fill material can help provide sufficient support for spacing of the substrates relative to one another. In further examples, the fill material 18 may not cure or may only partially cure. Providing a fill material 18 that does not cure or only partially cures can reduce stress transfer through the fill material 18 from the first transparent substrate 12 to the various environmentally sensitive components 16 that may be damaged by undesired pressure concentrations.

FIG. 5 schematically illustrates sealing the first transparent substrate 12 and the second substrate 14 together to hermetically seal the fill material 18 within the area 20. As shown, a laser 80 may be used to travel along the path of the perimeter frit 22 to heat and fuse the perimeter frit 22 to the second substrate 14. Alternative heating devices may also be used to fuse the perimeter frit 22. Still further, hermetic sealing may be achieved with adhesives, epoxies or the like.

Figure 7:
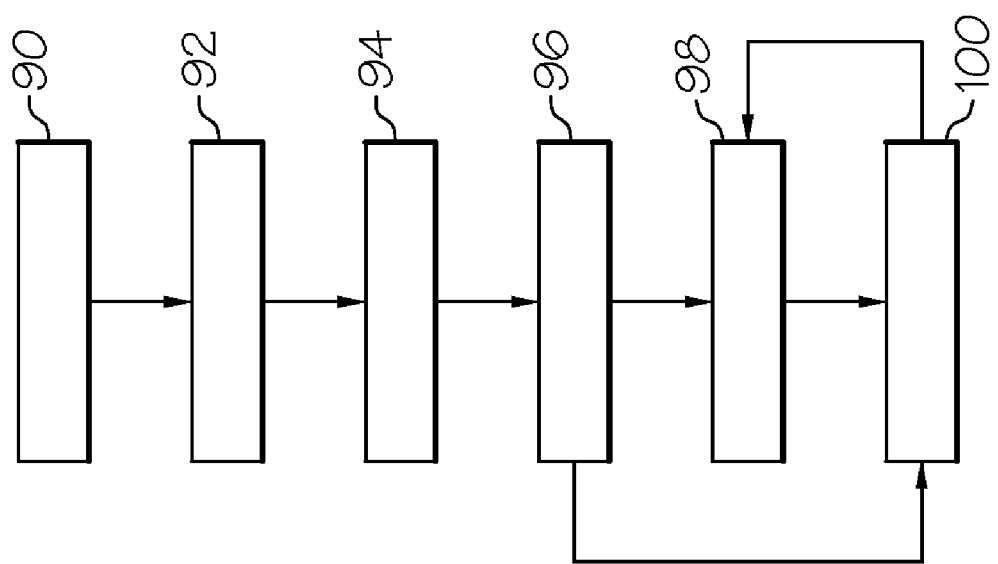
FIG. 7 is a flow chart illustrating steps of a method for assembling an optoelectronic device.

FIG. 7 summarizes an example method of assembling the optoelectronic device. The method can include further steps or may include less than all of the steps illustrated in further examples. As shown, the method can optionally start from step 90 of masking. The mask 40 can be secured in place relative to at least one substrate. For example, as shown, the mask 40 can be secured in place relative to the first transparent substrate 12 to define the spray coating area and to protect the non-target area from contamination. Indeed, as shown the protected non-target area includes the perimeter frit 22 as well as an inward protected area 13 of the surface 12a that circumscribes the target area of the surface 12a.

The method further includes the step 92 of applying fill material 18 to the surface 12a of at least one of the substrates. For example, as shown, the spray device 30 can be used to spray coat the fill material 18 to the surface 12a of the first transparent substrate 12 along substantially parallel rows that extend in the pressing direction 50. As shown, the fill material 18 can be applied along a surface area that is less than an interior surface area circumscribed by the perimeter frit 22 that is integral with the first transparent substrate 12.

The method further includes the step 94 of lowering the viscosity of the fill material 18 on the surface of the at least one substrate. For example, as shown, the first transparent substrate 12 can be placed on the hot plate 72. The hot plate 72 can then conduct heat to the first transparent substrate 12 to indirectly heat the fill material 18.

The method further includes the step 96 of pressing the second substrate 14 and the first transparent substrate 12 together such that the fill material 18 substantially fills an area 20 between the second substrate 14 and the first transparent substrate 12. As shown, the roller 70 can be traversed in the pressing direction 50 while the second substrate 14 is bent relative to the first transparent substrate 12 as the substrates are pressed together. Moreover, the roller 70 can be traversed in the pressing direction 50 while corresponding end portions 15a, 15b of the substrates are initially held at an angle "A" with respect to one another while the substrates are pressed together. Holding the end portions at the angle "A" can help avoid formation of bubbles. Moreover, spray coating the fill material 18 in the pressing direction 50 further helps avoid bubble formation that might otherwise occur with different spray patterns. Once complete, the fill material 18 substantially encapsulates the exposed portions 17 of the environmentally sensitive components 16. Moreover, as shown, the fill material 18 can migrate outward but stop without engaging the perimeter frit 22.

Due to the interaction of spraying path spacing and volume of fill material 18 sprayed, there is a slight thickness variation between the center of the parallel rows of the serpentine application path 60 and the edge 63 of the spray coating area. Using the example embodiment shown in FIG. 6, all lines of maximum thickness of fill material 18 at the first transparent substrate 12 are contacted simultaneously with the second substrate 14 during the pressing step. As such, the areas of different fill material thicknesses blend together such that air is not trapped during the pressing step.

The method can further include the optional step 98 of post-curing the fill material 18. As shown, the optional post-curing step 98 can occur before or after the step 100 of sealing the first transparent substrate 12 and the second substrate 14 together to hermetically seal the fill material 18 within the area 20.

It will be apparent to those skilled in the art that various modifications and variations can be made to the present disclosure without departing from the spirit and scope of the invention. Thus, it is intended that the present invention cover the modifications and variations of this disclosure provided they come within the scope of the appended claims and their equivalents.

What is claimed is:

1. A method for assembling an optoelectronic device including a first transparent substrate, a second substrate, and environmentally sensitive components, the method comprising the steps of:
    attaching a frit to at least one of the substrates such that the frit circumscribes an interior surface area of the at least one substrate;
    masking a non-target area including a perimeter of the frit and an inward protected area of the at least one substrate that circumscribes a target area of the at least one substrate;
    applying a fill material to a surface of the target area of the at least one substrate, wherein the mask prevents application of the fill material to the non-target area;
    lowering a viscosity of the fill material;
    pressing the first transparent substrate and the second substrate together such that the fill material substantially fills an area between the first transparent substrate and the second substrate and substantially encapsulates exposed portions of the environmentally sensitive components; and
    sealing the first transparent substrate and the second substrate together to hermetically seal the fill material within the area.

2. The method of claim 1, wherein the viscosity of the fill material is lowered by heating the fill material to a target temperature.

3. The method of claim 2, wherein the at least one substrate conducts heat to the fill material.

4. The method of claim 2, wherein the step of heating includes heating the first transparent substrate and the second substrate.

5. The method of claim 1, further comprising a step of post-curing the fill material.

6. The method of claim 1, wherein a roller is used to press the first transparent substrate and the second substrate together.

7. The method of claim 1, wherein corresponding end portions of the substrates are held at an angle with respect to one another while the first transparent substrate and the second substrate are pressed together along a pressing direction.

8. The method of claim 7, wherein the fill material is applied along substantially parallel rows that extend in the pressing direction.

9. The method of claim 7, wherein the first transparent substrate is bent relative to the second substrate as the substrates are pressed together.

10. The method of claim 1, wherein the fill material is applied by spray coating.

11. The method of claim 1, wherein the fill material is applied to the first transparent substrate.

12. The method of claim 1, wherein the fill material comprises silicone.

13. The method of claim 1, wherein a refractive index of the fill material is within a range of from about 1.5 to about 1.8.

14. The method of claim 1, wherein, before the fill material is heated to the target temperature, a viscosity of the fill material is within the range from about 30 cP to about 3500 cP.

15. The method of claim 1, wherein the environmentally sensitive components comprise optoelectronic components.

16. The method of claim 1, wherein the frit is attached to the first transparent substrate.

17. The method of claim 1, wherein the fill material is applied along a surface area less than an interior surface area circumscribed by the frit.

18. The method of claim 1, wherein, after the step of pressing, the fill material engages the interior surface area without engaging the frit.

* * * * *